(12) United States Patent
Farnworth et al.

(10) Patent No.: US 6,529,026 B1
(45) Date of Patent: *Mar. 4, 2003

(54) METHOD FOR FABRICATING AN INTERCONNECT FOR MAKING TEMPORARY ELECTRICAL CONNECTIONS TO SEMICONDUCTOR COMPONENTS

(75) Inventors: Warren M. Farnworth, Nampa, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/972,266

(22) Filed: Oct. 9, 2001

Related U.S. Application Data (62) Division of application No. 08/916,587, filed on Aug. 22, 1997, now Pat. No. 6,329,829.

(51) Int. Cl.[7] .................. G01R 31/02; H01R 9/00; H01R 12/04; H05K 7/12
(52) U.S. Cl. .................. 324/757; 324/755; 29/843; 361/771; 174/267
(58) Field of Search ................ 324/757, 755, 324/760, 765, 558, 158.1; 438/16–18; 257/668–669, 773, 787, 789, 793; 29/825, 829, 832, 833, 840, 843, 852; 361/767, 768, 771; 174/260, 267

(56) References Cited

U.S. PATENT DOCUMENTS

| | | | |
|---|---|---|---|
| 5,020,219 A | 6/1991 | Leedy | |
| 5,103,557 A | * 4/1992 | Leedy | .......... 29/407 |
| 5,329,423 A | 7/1994 | Scholz | |
| 5,367,253 A | 11/1994 | Wood et al. | |
| 5,408,190 A | 4/1995 | Wood et al. | |
| 5,440,240 A | 8/1995 | Wood et al. | |
| 5,475,317 A | 12/1995 | Smith | |
| 5,483,741 A | 1/1996 | Akram et al. | |
| 5,487,999 A | 1/1996 | Farnworth | |
| 5,493,237 A | 2/1996 | Volz et al. | |
| 5,495,179 A | 2/1996 | Wood et al. | |
| 5,519,332 A | 5/1996 | Wood et al. | |
| 5,588,359 A | 12/1996 | Hofmann et al. | |
| 5,592,736 A | 1/1997 | Akram et al. | |
| 5,634,267 A | 6/1997 | Farnworth et al. | |
| 5,678,301 A | 10/1997 | Gochnour et al. | |
| 5,691,649 A | 11/1997 | Farnworth et al. | |
| 5,781,022 A | 7/1998 | Wood et al. | |
| 5,789,278 A | 8/1998 | Akram et al. | |
| 5,793,117 A | 8/1998 | Shimada et al. | |

(List continued on next page.)

OTHER PUBLICATIONS

Lorenz, H., Suss Report, vol. 10, Third/Fourth Quarter 1996, technical brochure.

*Primary Examiner*—Kamand Cuneo
*Assistant Examiner*—Jermele Hollington
(74) *Attorney, Agent, or Firm*—Stephen A. Gratton

(57) ABSTRACT

An interconnect for making temporary electrical connections with semiconductor components includes a substrate with patterns of elastomeric contacts adapted to electrically engage contact locations (e.g., bond pads, solder bumps) on the semiconductor components. The elastomeric contacts can be formed of conductive elastomer materials, such as anisotropic adhesives and silver filled silicone, having metal particles for penetrating the contact locations. The substrate also includes patterns of metal conductors having non-oxidizing contact pads, which provide low resistance bonding surfaces for the elastomeric contacts. A method for fabricating the interconnect includes the step of depositing bumps in a required size and shape using stenciling, screen printing, or other deposition process. Following deposition, the bumps can be cured and planarized to form the elastomeric contacts. During a test procedure, the elastomeric contacts can be loaded in compression to compliantly engage the contact locations.

22 Claims, 3 Drawing Sheets

U.S. PATENT DOCUMENTS

| | | | |
|---|---|---|---|
| 5,801,452 A | 9/1998 | Farnworth et al. | |
| 5,815,000 A | 9/1998 | Farnworth et al. | |
| 5,820,716 A | 10/1998 | Tuttle | |
| 5,825,195 A | 10/1998 | Hembree et al. | |
| 5,834,945 A | 11/1998 | Akram et al. | |
| 5,838,161 A | 11/1998 | Akram et al. | |
| 5,844,418 A | 12/1998 | Wood et al. | |
| 5,864,946 A | 2/1999 | Eldridge et al. | |
| 5,900,738 A | 5/1999 | Khandros et al. | |
| 5,915,755 A | 6/1999 | Gochnour et al. | |
| 5,915,977 A | 6/1999 | Hembree et al. | |
| 5,931,685 A | 8/1999 | Hembree et al. | |
| 5,952,840 A | 9/1999 | Farnworth et al. | |
| 5,962,921 A | 10/1999 | Farnworth et al. | |
| 5,974,662 A | 11/1999 | Eldridge et al. | |
| 5,982,185 A | 11/1999 | Farnworth | |
| 6,002,180 A | 12/1999 | Akram et al. | |
| 6,005,288 A | 12/1999 | Farnworth et al. | |
| 6,011,307 A | 1/2000 | Jiang et al. | |
| 6,016,060 A | 1/2000 | Akram et al. | |
| 6,025,730 A | 2/2000 | Akram et al. | |
| 6,025,731 A | 2/2000 | Hembree et al. | |
| 6,040,239 A | 3/2000 | Akram et al. | |
| 6,040,702 A | 3/2000 | Hembree et al. | |
| 6,064,216 A | 5/2000 | Farnworth et al. | |
| 6,064,217 A * | 5/2000 | Smith | 324/760 |
| 6,068,669 A | 5/2000 | Farnworth et al. | |
| 6,072,324 A | 6/2000 | Farnworth | |
| 6,072,326 A | 6/2000 | Akram et al. | |
| 6,077,723 A | 6/2000 | Farnworth et al. | |
| 6,091,250 A | 7/2000 | Wood et al. | |
| 6,091,251 A | 7/2000 | Wood et al. | |
| 6,107,109 A | 8/2000 | Akram et al. | |
| 6,114,240 A | 9/2000 | Akram et al. | |
| 6,127,736 A | 10/2000 | Akram | |
| 6,130,148 A | 10/2000 | Farnworth et al. | |
| 6,188,232 B1 | 2/2001 | Akram et al. | |
| 6,208,157 B1 | 3/2001 | Akram et al. | |
| 6,215,322 B1 | 4/2001 | Farnworth et al. | |
| 6,222,379 B1 | 4/2001 | Farnworth et al. | |
| 6,232,243 B1 | 5/2001 | Farnworth et al. | |
| 6,255,833 B1 | 7/2001 | Akram et al. | |
| 6,259,036 B1 * | 7/2001 | Farnworth | 438/108 |
| 6,278,286 B1 | 8/2001 | Farnworth et al. | |
| 6,329,829 B1 | 12/2001 | Farnworth et al. | |
| 6,333,555 B1 | 12/2001 | Farnworth et al. | |

\* cited by examiner

METHOD FOR FABRICATING AN INTERCONNECT FOR MAKING TEMPORARY ELECTRICAL CONNECTIONS TO SEMICONDUCTOR COMPONENTS

CROSS REFERENCE TO RELATED APPLICATIONS

This application is a division of patent application Ser. No. 08/916,587, filed on Aug. 22, 1997, now U.S. Pat. No. 6,329,829 B1.

This application is related to patent application Ser. No. 09/436,483, filed on Nov. 8, 1999, now U.S. Pat. No. 6,278,286 B1.

FIELD OF THE INVENTION

This invention relates generally to semiconductor manufacture and specifically to an interconnect and system for making temporary electrical connections to semiconductor components such as dice, wafers, and chip scale packages.

BACKGROUND OF THE INVENTION

In the manufacture of semiconductor components it is sometimes necessary to make temporary electrical connections for testing or other purposes. For example, wafer probe testing requires electrical connections with contact locations (e.g., test pads, bond pads) on a semiconductor wafer. One method for making temporary electrical connections with a semiconductor wafer is with an interconnect known as a "probe card". Typically probe cards include contacts in the form of metal probe needles. A wafer handler aligns the wafer with the probe card, and places the probe needles in electrical contact with the wafer. Test signals can then be transmitted through the probe needles to test the integrated circuits contained on the wafer.

Singulated semiconductor dice must also be tested in order to certify each die as a known good die (KGD). For testing the dice can be packaged in carriers that include interconnects having contacts for making temporary electrical connections with contact locations on the dice. Chip scale packages also require testing using interconnects adapted to make temporary electrical connections with external contact locations on the packages. For example, some chip scale packages include external contact locations in the form of solder bumps.

In making temporary electrical connections to semiconductor components, interconnects must be adapted to penetrate native oxide layers present on the contact locations. For example, aluminum bond pads on wafers and dice can include oxide layers that must be penetrated to make reliable electrical connections. Contact locations formed of solder, and other alloys, can also include native oxide layers that must be penetrated to contact the underlying metal. Another consideration in making temporary electrical connections to semiconductor components is that the interconnects preferably have compliant characteristics. This helps to prevent excessive contact forces from damaging the contact locations on the component. For example, probe needles have a natural resiliency that allows a probe card to be overdriven in the z-direction with respect to the wafer. The needles are initially placed in "touch" contact with the wafer, and then driven into the contact locations.

If interconnects do not include naturally resilient contacts, compliancy can be achieved with a mounting structure for the contacts. For example, test carriers for bare dice can include resilient biasing members that press against the interconnects or dice, and cushion the contact forces applied by the interconnect contacts. In addition to cushioning contact forces, compliancy can also be used to compensate for dimensional variations among the contact locations on a component, particularly in the z-direction.

The present invention is directed to improved interconnects having naturally resilient contacts. The interconnects can be used to construct wafer level test systems, or die level test systems, and to perform testing methods for semiconductor components.

SUMMARY OF THE INVENTION

In accordance with the present invention, improved interconnects for making temporary electrical connections to semiconductor components are provided. Also provided are methods for fabricating the interconnects, test systems constructed with the interconnects, and test methods employing the interconnects.

In an illustrative embodiment the interconnect comprises: a substrate; electrical conductors formed on the substrate; contact pads formed on the conductors of a non-oxidizing material; and elastomeric contacts formed on the contact pads. The elastomeric contacts can be bumps configured to contact flat contact locations (e.g., bond pads), or alternately recessed members configured to contact bumped contact locations (e.g., solder bumps). In addition, the interconnect can be configured for constructing a wafer level test system for testing semiconductor wafers, or a die level test system for testing singulated dice and chip scale packages.

Suitable materials for forming the substrate include silicon, ceramic, or FR-4 material. The conductors can be formed of a highly conductive metals such as copper, aluminum and tungsten. Suitable materials for forming the contact pads include palladium and gold. The elastomeric contacts can be formed of a conductive elastomeric material, such as silver filled silicone, and anisotropic adhesives. Using conductive elastomers, the elastomeric contacts are naturally resilient to provide compliancy for cushioning contact forces, and for compensating for z-direction dimensional variations in the contact locations. In addition, the resiliency of the elastomeric contacts allows the contacts to be compression loaded during test procedures, while conductive particles therein, penetrate oxide layers covering the contact locations.

A method for fabricating the interconnect includes the steps of: providing a substrate; forming a pattern of conductors on the substrate; forming contact pads on the conductors by plating portions thereof with a non-oxidizing metal; and then forming elastomeric contacts on the contact pads in patterns corresponding to patterns of contact locations on a semiconductor component. The conductors can be formed using a thin film metallization process, or a thick film metallization process. The contact pads can be formed using an electroless deposition process, or using an electrodeposition process. The elastomeric contacts can be formed by stenciling, screen printing or otherwise depositing a viscous conductive elastomeric material in a desired pattern of bumps, followed by partial curing, planarization and then total curing.

DETAILED DESCRIPTION OF THE PREFERRED EMBODIMENTS

Figure 1:
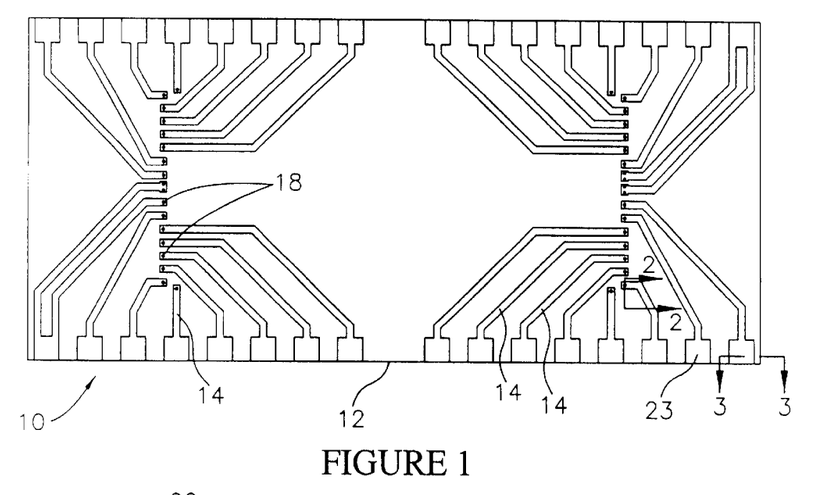
FIG. 1 is a plan view of a die level interconnect constructed in accordance with the invention.
Figure 2:
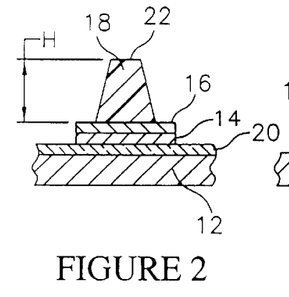
FIG. 2 is an enlarged cross sectional view taken along section line 2—2 of FIG. 1 showing an elastomeric contact.
Figure 3:
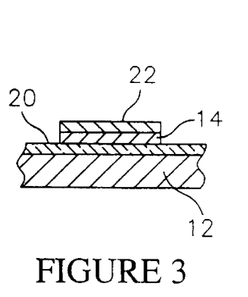
FIG. 3 is an enlarged cross sectional view taken along section line 3—3 of FIG. 1, showing a bonding pad and a conductor of the interconnect.

Referring to FIGS. 1–3, a die level interconnect 10 constructed in accordance with the invention is shown. The interconnect 10, generally stated, includes: a substrate 12; patterns of conductors 14 formed on the substrate 12; contact pads 16 (FIG. 2) formed on the conductors 14 of a non-oxidizing material; and elastomeric contacts 18 formed on the contact pads 16.

The substrate 12 comprises a material having a coefficient of thermal expansion (CTE) that closely matches the CTE of semiconductor components formed of silicon or other semiconducting material. Suitable materials for the substrate 12 include monocrystalline silicon, silicon-on-glass, silicon-on-sapphire, germanium, ceramic and FR-4 materials.

With the substrate 12 formed of silicon, an insulating layer 20 (FIG. 2) is required to provide electrical insulation for the conductors 14 and the elastomeric contacts 18. The insulating layer 20 can comprise an electrically insulating material such as an oxide, dielectric or insulating polymer. With the substrate 12 formed of ceramic or FR-4, the insulating layer 20 is not required.

The conductors 14 are formed on the insulating layer 20 in a required pattern. Preferably the conductors 14 comprise a highly conductive metal such as copper, aluminum, titanium, tantalum, tungsten, molybdenum and alloys of these metals. As will be further explained, the conductors 14 can be formed using a thick film deposition process, or a thin film deposition process.

The contact pads 16 can be formed on selected portions of the conductors 14 to provide bonding surfaces for the elastomeric contacts 18. The locations of the contact pads 16 will be determined by the required locations of the elastomeric contacts 18. Preferably the contact pads 16 comprise a non-oxidizing metal such as gold or palladium. The non-oxidizing contact pads 16 form "touch contact" surfaces and provide low resistance electrical paths between the conductors 14 and the elastomeric contacts 18.

The conductors 14 can also include bonding pads 23 (FIG. 3) formed along the peripheral edges, or other locations, on the interconnect 10. The bonding pads 23 provide surfaces for wire bonding, TAB bonding, soldering or otherwise electrically connecting the conductors 14 to test circuitry. The bonding pads 23 can be formed of a same metal as the conductors 14 or of a different metal particularly adapted to wire bonding, TAB bonding, or soldering. If desired, the bonding pads 23 can be formed of the same metal as the contact pads 16.

The elastomeric contacts 18 comprise a conductive elastomeric material deposited on the contact pads 16 as bumps of a desired size and shape. The locations of the elastomeric contacts 18 will match corresponding contact locations on the semiconductor components being tested. For example, if the contact locations are patterns of bond pads on a semiconductor die or wafer, the elastomeric contacts 18 can be located in patterns which match the patterns (i.e., locations) of the bond pads.

Suitable materials for forming the elastomeric contacts 18 include metal filled adhesives (e.g., silver filled silicone) that are conductive in any direction. Alternately, the elastomeric contacts 18 can be anisotropic adhesives that are conductive in only one direction. For example, Z-axis anisotropic adhesives are filled with conductive particles to a low level such that the particles do not contact each other in the X and Y planes. However, compression of the anisotropic adhesive provides an electrical path in the Z-direction. Curing is typically accomplished by compression of the conductive adhesive along the direction of conduction.

The elastomeric contacts 18 can be formed by screen printing, stenciling, or otherwise dispensing, a viscous conductive elastomeric material in a pattern of bumps having a required size and shape. The conductive elastomeric material can be provided in either a thermal plastic configuration or a thermal setting configuration. Thermal plastic conductive elastomers are heated to soften for use and then cooled for curing. Thermal setting conductive elastomers are viscous at room temperature but require heat curing at temperatures from 100–300° C. for from several minutes to an hour or more. Suitable conductive elastomers for forming the elastomeric contacts 18 include: materials containing dendritic silver flakes; "X-POLY" and "Z-POXY", by A.I. Technology, Trenton, N.J.; and "SHELL-ZAC", by Sheldahl, Northfield, Minn. Other suitable conductive elastomers are also sold by 3M, St. Paul, Minn.

In the illustrative embodiment, the elastomeric contacts 18 are generally conically shaped bumps with a flat tip portion 22. As will be further described, this shape can be achieved using a screen printing process. If required, the tip portions 22 (FIG. 2) of the elastomeric contacts 18 can be planarized such that a height "H" of the elastomeric contacts 18 is uniform. Planarization can be accomplished by contact with a planar surface during the curing process. Additionally, the elastomeric contacts 18 can be placed in compression during the curing process by contact with a planar surface. A representative height "H" for the elastomeric contacts 18 can be from 1–20 mils. A representative diameter at the base of the elastomeric contacts 18 can be from 1–40 mils.

Figure 4A:
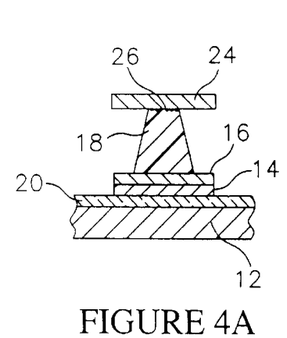
FIG. 4A is an enlarged cross sectional view of the elastomeric contact in electrical contact with a flat contact location on a semiconductor component.

As shown in FIG. 4A, the elastomeric contacts 18 can be used to establish temporary electrical connections with flat contact locations 24 on a semiconductor component. For example, the flat contact locations 24 can comprise thin film metal bond pads on a semiconductor wafer or die. Typical metal bond pads include aluminum thin films having a thickness of about 1 $\mu$m to 1.5 $\mu$m. As will be further explained, the elastomeric contacts 18 can be placed in compression during contact with the contact locations 24, such that metal particles 26 within the contacts 18 penetrate oxide layers covering the contact locations 24. In addition, the conductive materials used to form the elastomeric contacts 18 are naturally resilient such that the contacts 18 will possess compliant characteristics. This compliancy can also provide force for pressing the metal particles 26 into the contact locations 24, and for accommodating variations in the z-directions locations of the contact locations 24.

Figure 4B:
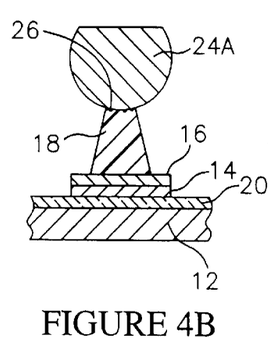
FIG. 4B is an enlarged cross sectional view of the elastomeric contact in electrical contact with a bumped contact location on a semiconductor component.

As shown in FIG. 4B, the elastomeric contacts 18 can also be used to establish temporary electrical communication with bumped contact locations 24A on semiconductor components. For example, the bumped contact locations 24A can comprise solder bumps on bumped dice, bumped wafers, or bumped chip scale packages. Typical bumped contact locations 24A have a diameter of from about 5 mils to 30 mils.

Figure 2A:
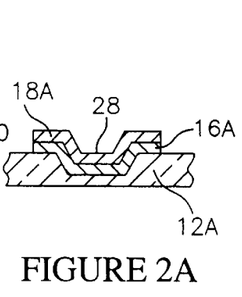
FIG. 2A is an enlarged cross sectional view equivalent to FIG. 2 of an alternate embodiment elastomeric contact for bumped contact locations.
Figure 4C:
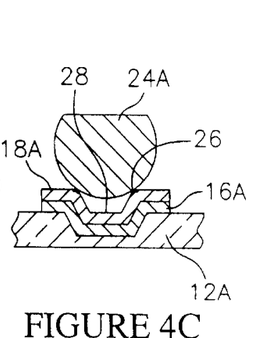
FIG. 4C is an enlarged cross sectional view of the alternate embodiment elastomeric contact in electrical contact with a bumped contact location on a semiconductor component.

Alternately, as shown in FIGS. 2A and 4C, indentation elastomeric contacts 18A can be used to electrically engage the bumped contact locations 24A. In the alternate embodiment, the substrate 12A comprises ceramic, or other insulating material, such that an insulating layer is not required. The indentation elastomeric contacts 18A can include indentations 28 in the substrate 12A sized to retain the bumped contact locations 24A. With a ceramic substrate 12A, the indentations 28 can be formed by laser machining or etching depressions in the substrate 12A. Contact pads 16A and elastomeric contacts 18A can then be formed in the indentations 28 in electrical communication with associated patterns of conductors (not shown).

As shown in FIG. 4C, metal particles 26 within the elastomeric contacts 18A can break through oxide layers on the bumped contact locations 24A. As before, the resiliency of the elastomeric contacts 18A under compression, presses the metal particles 26 into the bumped contact locations 24A.

Figure 5A:
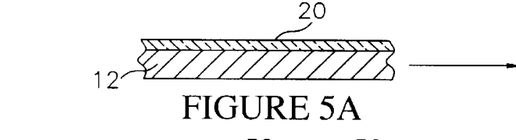
FIGS. 5A–5D are schematic cross sectional views illustrating process steps for fabricating the elastomeric contacts.

Referring to FIGS. 5A–5D, a method for fabricating the elastomeric contacts 18 is illustrated. Initially, as shown in FIG. 5A, the substrate 12 can be formed or provided. With the substrate 12 formed of monocrystalline silicon, the insulating layer 20 can be grown or deposited on the substrate 12. One suitable material for the insulating layer 20 is silicon dioxide ($SiO_2$) having a thickness about 1000 Å to 10 $\mu$m.

Using a CVD process, TEOS (tetraethylorthosilane) can be injected into a reaction chamber to grow silicon dioxide ($SiO_2$) at a temperature of about 400° C. The insulating layer 20 can also be formed by exposing the substrate 12 to an oxidizing atmosphere in a reaction chamber. Alternately, the insulating layer 20 can be formed of a dielectric material, such as $Si_3N_4$, deposited using CVD or other deposition process. Still further, the insulating layer 20 can be formed of polyimide, or similar electrically insulating polymeric material, spun on or otherwise deposited on the substrate 12. In the case of a polymeric material, the natural resiliency of the material allows the insulating layer 20 to function as an additional compliant layer. This compliancy will allow the subsequently formed elastomeric contacts 18 to further flex to accommodate z-direction variations in the contact locations 24.

Figure 5B:
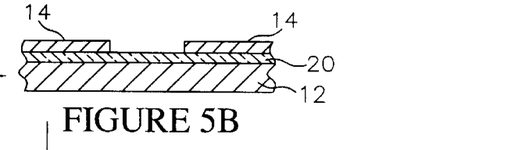

As shown in FIG. 5B, following formation of the insulating layer 20, the conductors 14 can be formed on the insulating layer 20 in required patterns. Typically these patterns match the patterns of contact locations on a particular semiconductor component. One method for forming the conductors 14 is with a thick film metallization process, such as stenciling or screen printing. Alternately, the conductors 14 can be formed using a thin film metallization process including blanket deposition (e.g., CVD), photopatterning, and etching. The conductors 14 can also be directly written onto the substrate 12 in a desired pattern using a micro pen apparatus commercially available from Micropen of Pittsford, N.Y. under the trademark "MICRO-PEN".

Figure 5C:
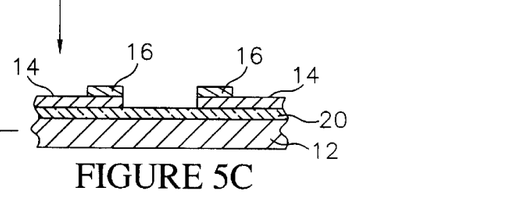

Next, as shown in FIG. 5C, the contact pads 16 can be formed on the conductors 14 in required patterns. Preferred materials for the contact pads 16 include gold and palladium deposited by electroless deposition to a thickness of from 500 Å to 2$\mu$m. The contact pads 16 can also be formed using an electrodeposition process.

Figure 5D:
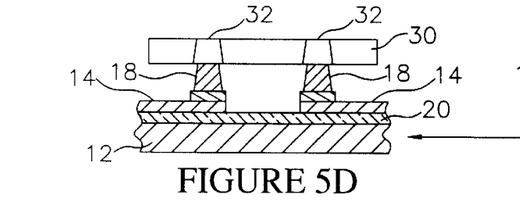

Next, as shown in FIG. 5D, the elastomeric contacts 18 can be stenciled onto the contact pads 16 using a screen 30 having a pattern of openings 32. The openings 32 can be sized and shaped to form the elastomeric contacts 18 with a desired size and shape. One method for screen printing small closely spaced features is described in U.S. Pat. No. 5,588,359 entitled "Method For Forming A Screen For Screen Printing A Pattern Of Small Closely Spaced Features Onto A Substrate", incorporated herein by reference. Depending on the materials employed, a conductive elastomeric material can be dispensed in a viscous state and allowed to "air dry" to a semi-cured condition. This can be followed by total curing by heating in an oven for a required period of time. In place of a screen printing process, the conductive elastomeric material can be dispensed using nozzles, syringes or other suitable dispensing processes.

Figure 6A:
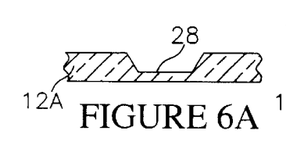
FIGS. 6A–6C are schematic cross sectional views illustrating process steps for fabricating the alternate embodiment elastomeric contacts.
Figure 6B:
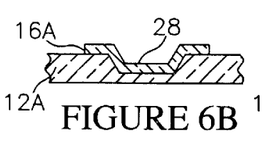
Figure 6C:
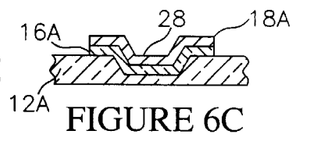

Referring to FIGS. 6A–6C, a method for fabricating the alternate embodiment elastomeric contacts 18A is illustrated. Initially, as shown in FIG. 6A, the substrate 12A can be formed or provided. With the substrate 12A formed of an insulating material, an insulating layer as previously described is not required. Next, the indentations 28 can be formed in the substrate 12A by laser machining, punching or etching the substrate 12A. Preferably the indentations 28 are formed, and then the patterns of conductors (not shown) are formed proximate to, or within, the indentations 28.

Next, as shown in FIG. 6B, contact pads 16A can be formed in the indentations 28. The contact pads 16A can be formed on conductors, substantially as previously described. Alternately, the contact pads 16A can be formed in electrical communication with the conductors but not necessarily on the conductors.

Next, as shown in FIG. 6C, a conductive elastomeric material can be deposited on the contacts pads 16A and within the indentations 28 to complete the elastomeric contacts 18A. The conductive elastomeric material can be deposited to a desired thickness in electrical communication with the previously formed pattern of conductors (not shown).

Figure 7A:
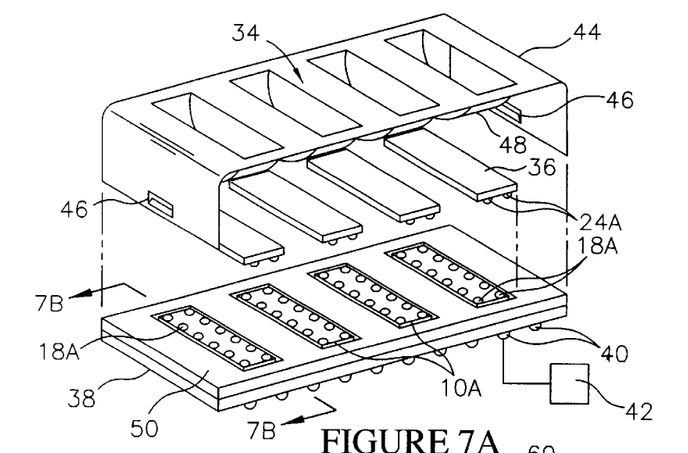
FIG. 7A is a schematic perspective view of a system constructed in accordance with the invention for testing bare dice or chip scale packages.
Figure 7B:
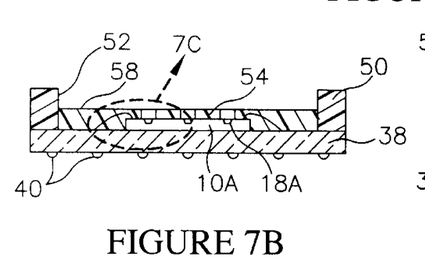
FIG. 7B is a cross sectional view taken along section line 7B—7B of FIG. 7A.
Figure 7C:
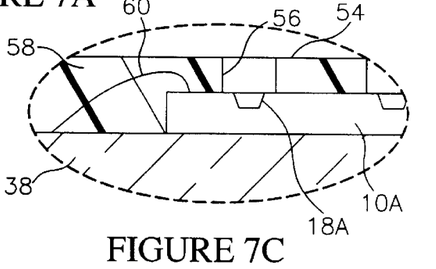
FIG. 7C is an enlarged cross sectional view taken along section line 7C of FIG. 7B.

Referring to FIGS. 7A–7C, a test system 34 for testing semiconductor components 36 is illustrated. In this system 34, the components 36 comprise chip scale packages, or alternately semiconductor dice, having bumped contact locations 24A, as previously described. However, it is to be understood that the system 34 could also be used to test chip scale packages, and semiconductor dice, having flat contact locations 24 (FIG. 4A) as previously described.

The test system 34 includes a base 38 with external contacts 40. The external contacts 40 comprise a ball grid array (BGA) configured for electrical communication with test circuitry 42. The test circuitry 42 can be associated with a burn-in board or other test apparatus (not shown). In addition, the test system 34 includes multiple interconnects 110A having elastomeric contacts 18A formed substantially as previously described. The test system 34 also includes a force applying mechanism 44 comprising clip portions 46 and springs 48 configured to bias the components 36 against the interconnects 10A. The springs 48 can be formed of metal, or of an elastomeric material such as silicone, butyl rubber, or fluorosilicone. Suitable elastomeric materials include "PORON" available from Rogers.

As shown in FIG. 7B, the system 34 also includes a coarse alignment member 50 adapted to coarse align the components 36 to the interconnects 10A. In the illustrative embodiment, the coarse alignment member 50 comprises a polymer fence formed on the base 38. One suitable polymer for forming the coarse alignment member 50 comprises a negative tone resist, which is blanket deposited to a desired thickness, exposed, developed and then cured. A suitable resist formulation is sold by Shell Chemical under the trademark "EPON RESIN SU-8". Such a resist can be deposited to a thickness of from about 5–50 mils. A conventional resist coating apparatus, such as a spin coater, can be used to deposit the resist onto the base 38. The deposited resist can then be "prebaked" at about 95° C. for about 15 minutes and exposed in a desired pattern using a conventional UV aligner with a dose of about 165 mJ/cm$^2$. Developing can be accomplished with a solution of PGMEA (propyleneglycol-monomethylether-acetate). This can be followed by a hard bake at about 200° C. for about 30 minutes.

As shown in FIG. 7B, the hard baked coarse alignment member 50 includes patterns of alignment openings 52. Each alignment opening 52 is sized and shaped to contact the peripheral edges of a semiconductor component 36, to align the components 36 to the interconnects 10A. This provides coarse alignment of the bumped contact locations 24A on the components 36 to the elastomeric contacts 18A on the interconnects 10A. As used herein, the term "coarse alignment" refers to a first alignment stage in which a registration between the bumped contact locations 24A and elastomeric contacts 18A is from about 1 mil to 6 mils.

As also shown in FIG. 7B, in addition to the coarse alignment member 50 on the base 38, a fine alignment member 54 can be formed on the interconnects 10A. The fine alignment member 54 includes alignment openings 56 (FIG. 7C) configured to align individual bumped contact locations 24A on the components 36 to individual elastomeric contacts 18A on the interconnects 10A. As used herein, the term "fine alignment" refers to a second alignment stage in which a registration between the bumped contact locations 24A and elastomeric contacts 18A is from about 1 mil to 3 mils.

The fine alignment member 54 can comprise a same deposited polymer as the coarse alignment member 50. The size of the alignment openings 56 on the coarse alignment member 50 is dependent on the sizes of the bumped contact locations 24A. A representative diameter for the alignment openings 56 for 12 mil diameter bumped contact locations 24A can be from 13 mils to 15 mils. Preferably the fine alignment member 54 has a thickness that is less than an average height of the bumped contact locations 24A. This thickness is preferably from about 3 mils to 7 mils.

Alternately, the coarse alignment member 50, and fine alignment member 54, can be omitted from the system 34, and optical alignment techniques can be used to align the semiconductor components 36 to the interconnects 10A. Such a technique is described in U.S. Pat. No. 5,634,267, entitled "Method And Apparatus For Manufacturing Known Good Semiconductor Die", incorporated herein by reference.

As shown in FIG. 7C, an encapsulant layer 58 can also be deposited on the base 38 to encapsulate bond wires 60 and portions of the interconnects 10A. The bond wires 60 establish electrical communication between the conductors 14 (FIG. 1) on the interconnects 10A, and the external contacts 40 on the base 38. The bond wires 60 can be bonded to the bonding pads 23 (FIG. 1) on the interconnects 10A and to corresponding bonding pads (not shown) on the base 38 in electrical communication with the external contacts 40.

The encapsulant layer 58 can be formed on the base 38 after the coarse alignment member 50 and fine alignment members 54 have been formed. The encapsulant layer 58 can be formed of curable material such as an epoxy, silicone, polyimide or room temperature vulcanizing material. This encapsulant layer 58 can be applied in the manner of a "glob top" using a dispensing nozzle, or can be applied using a spatula tool, and then cured as required.

In the assembled system 34, the components 36 are biased against the interconnects 10A by the force applying mechanism 44. In addition, the bumped contact locations 24A on the components seat in the elastomeric contacts 18A. The compliancy provided by the indentation elastomeric contacts 18A presses metal particles 26 (FIG. 4C) into the bumped contact locations 24A to form the temporary electrical connections.

Figure 8:
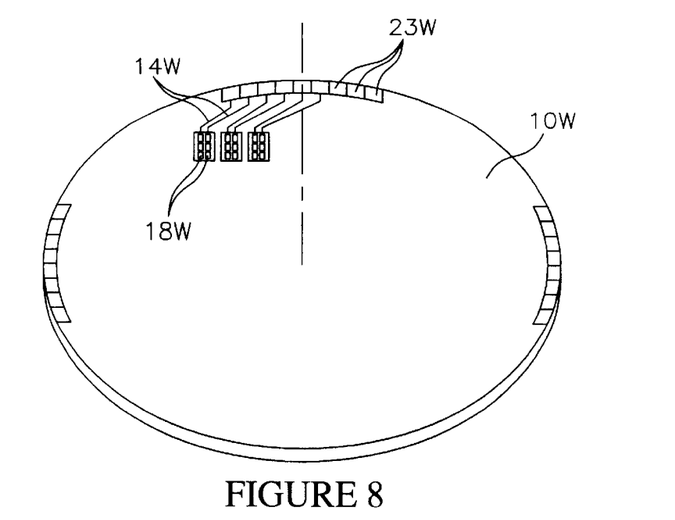
FIG. 8 is a schematic perspective view of a wafer level interconnect constructed in accordance with the invention.
Figure 9:
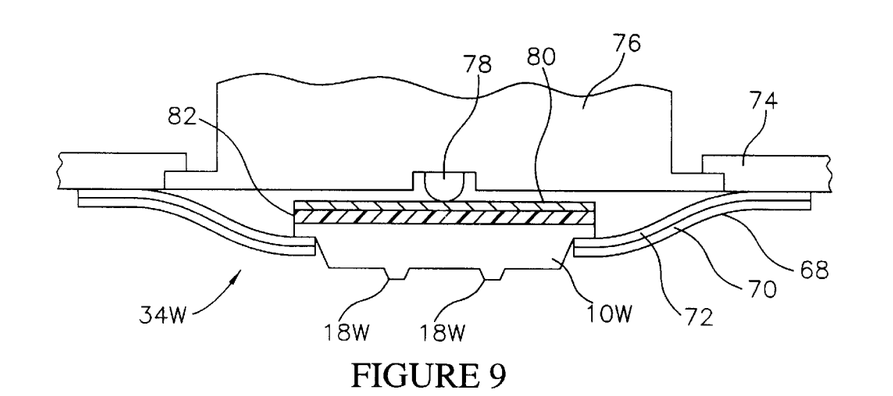
FIG. 9 is a schematic cross sectional view of a wafer level test system constructed in accordance with the invention.
Figure 10:
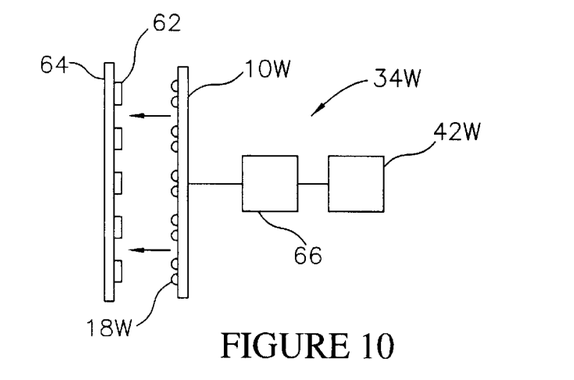
FIG. 10 is a block diagram of the wafer level test system shown in FIG. 9.

Referring to FIGS. 8–10, a wafer level interconnect 10W constructed in accordance with the invention is illustrated. The wafer level interconnect 10W is adapted to establish temporary electrical communication with semiconductor dice 62 (FIG. 10) contained on a semiconductor wafer 64 (FIG. 10). The wafer level interconnect 10W includes patterns of elastomeric contacts 18W equivalent to the elastomeric contacts 18 (FIG. 2), or 18A (FIG. 2A), previously described. The elastomeric contacts 18W are in electrical communication with patterns of conductors 14W having bonding pads 23W, also substantially as previously described.

In this embodiment the wafer level interconnect 10W has a size and outline that correspond to a conventional semiconductor wafer. In addition, the wafer level interconnect 10W includes patterns of elastomeric contacts 18W adapted to simultaneously contact all of the dice 62 on the wafer 64. Alternately, the wafer level interconnect 10W can be configured in the manner of a probe card for testing from only one to several dice at once.

As shown in FIGS. 9 and 10, a wafer level test system 34W for testing dice 62 (FIG. 10) contained on semiconductor wafer 64 (FIG. 10) includes the wafer level interconnect 10W and a wafer probe handler 66 (FIG. 10). Suitable wafer probe handlers 66 are commercially available from Electroglass and others. The wafer probe handler 66 includes or is in electrical communication with test circuitry 42W (FIG. 10) adapted to apply test signals to the integrated circuits contained on the wafer 64.

As shown in FIG. 9, the system 34W also includes a probe card fixture 74 for mounting the wafer level interconnect 10W to the wafer probe handler 66. A multi layered tape 68 establishes electrical communication between the wafer level interconnect 10W and the test circuitry 42W. The multi layered tape 68 is similar to TAB tape and comprises a polymer film 70 with patterns of conductors 72 formed thereon. The multi layered tape 68 can be bonded to the bonding pads 23W (FIG. 8) on the wafer level interconnect 10W and to corresponding connection points on the probe card fixture 74. In addition to establishing electrical communication the multi layered tape 68 physically attaches the wafer level interconnect 10W to the probe card fixture 74. In place of multi layered tape 68, wire bonding or other method, can be used to form electrical connections between the interconnect 10W and probe card fixture 74.

A force applying mechanism 76 and a force applying member 78 are associated with the probe card fixture 74. The force applying member 78 presses against a pressure plate 80 and a compressible member 82 in contact with a backside of the wafer level interconnect 10W. The compressible member 82 can be formed of an elastomeric material, such as silicone, or as a gas filled bladder. The compressible member 82 cushions the forces applied to the wafer 64 and allows the wafer level interconnect 10W to self planarize to the wafer 64. The wafer probe handler 66 can also include a chuck (not shown) for supporting and moving the wafer 64 as required. Systems similar to the wafer level test system 34W are described in U.S. patent application Ser. No. 08/797,719 entitled "Probe Card For Semiconductor Wafers And Method And System For Testing Wafers", incorporated herein by reference.

Thus the invention provides improved interconnects and systems for testing semiconductor dice, packages and wafers. While the invention has been described with reference to certain preferred embodiments, as will be apparent to those skilled in the art, certain changes and modifications can be made without departing from the scope of the invention as defined by the following claims.

What is claimed is:

1. An interconnect for making electrical connections with a semiconductor component having a plurality of bumped contacts comprising:

a substrate;

a plurality of conductors on the substrate; and a plurality of contacts on the substrate configured to retain and electrically engage the bumped contacts, the contacts comprising indentations at least partially covered with resilient electrically conductive elastomeric layers in electrical communication with the conductors and a plurality of conductive particles in the layers configured to penetrate the bumped contacts.

2. The interconnect of claim 1 wherein each conductive particle comprises a dendritic metal particle.

3. The interconnect of claim 1 further comprising a plurality of non-oxidizing contact pads within the indentations configured to provide surfaces for the layers.

4. The interconnect of claim 1 wherein the layers comprise a material selected from the group consisting of silicone, silver filled silicone and anisotropic adhesives.

5. A method for fabricating an interconnect for making electrical connections with contacts on a semiconductor component comprising:

providing a substrate;

forming a plurality of conductors on the substrate; and forming a plurality of bumps on the substrate in electrical communication with the conductors, the bumps comprising a resilient electrically conductive elastomeric material and a plurality of conductive particles in the material configured to penetrate the contacts on the component and to provide conductive paths to the conductors.

6. The method of claim 5 wherein the forming the plurality of bumps step comprises screen printing.

7. The method of claim 5 wherein the material is selected from the group consisting of silicone, anisotropic adhesives and silver filled silicone.

8. The method of claim 5 wherein the forming the plurality of bumps step comprises depositing the material in a viscous state and then curing the material in contact with a planar surface.

9. The method of claim 8 wherein the curing step is performed with the material under compression.

10. A method for fabricating an interconnect for making temporary electrical connections with a semiconductor component having bumped contacts comprising:

providing a substrate;

forming a plurality of indentations in the substrate sized to retain the bumped contacts;

at least partially covering the indentations with a plurality of viscous conductive elastomeric layers comprising a plurality of electrically conductive particles configured to penetrate the bumped contacts;

curing the layers; and forming a plurality of conductors on the substrate in electrical communication with the layers.

11. The method of claim 10 further comprising forming a plurality of non-oxidizing metal layers in the indentations prior to the covering step.

12. The method of claim 10 wherein the layers comprise a material selected from the group consisting of silicone, silver filled silicone and anisotropic adhesives.

13. The method of claim 10 wherein each electrically conductive particle comprises a dendritic metal particle.

14. The method of claim 10 wherein the covering step is performed by stenciling, screen printing or depositing a conductive material.

15. A method for fabricating an interconnect for making electrical connections with a semiconductor component having a plurality of contacts thereon comprising:

providing a substrate;

forming a plurality of conductors on the substrate;

forming a plurality of contact pads on the substrate in electrical communication with the conductors; and forming a plurality of elastomeric contacts on the substrate by depositing and curing a resilient conductive elastomeric material on the contact pads having a plurality of dendritic metal particles embedded therein configured to penetrate the contacts, the material configured for compression during a test procedure to press the conductive particles into the contacts.

16. The method of claim 15 wherein the contact pads comprise gold or palladium.

17. The method of claim 15 further comprising planarizing the elastomeric contacts by contact with at least one planar surface during curing of the material.

18. The method of claim 15 wherein the elastomeric contacts comprise indentations at least partially covered by the material.

19. An interconnect for making an electrical connection with a semiconductor component having a bumped contact comprising:

a substrate; and a contact on the substrate configured to electrically engage the bumped contact, the contact comprising an indentation at least partially covered with a resilient electrically conductive elastomeric layer comprising a plurality of conductive particles configured to penetrate the bumped contact, the resilient electrically conductive elastomeric layer configured to provide compliancy for cushioning contact forces and for compensating for dimensional variations.

20. The interconnect of claim 19 wherein the resilient electrically conductive elastomeric layer comprises a material selected from the group consisting of silicone, silver filled silicone and anisotropic adhesives.

21. An interconnect for making an electrical connection with a semiconductor component having a bumped contact comprising:

a substrate; and a contact on the substrate configured to electrically engage the bumped contact, the contact comprising an indentation and a conductive elastomeric layer on the indentation containing a plurality of conductive particles, the conductive elastomeric material configured for compression by the bumped contact during a test procedure to press the conductive particles into the bumped contact.

22. The interconnect of claim 21 wherein the conductive elastomeric layer comprises a material selected from the group consisting of silicone, silver filled silicone and anisotropic adhesives.

\* \* \* \* \*